US007002852B2

(12) United States Patent
Khang et al.

(10) Patent No.: US 7,002,852 B2
(45) Date of Patent: Feb. 21, 2006

(54) DATA OUTPUT CIRCUITS FOR SYNCHRONOUS INTEGRATED CIRCUIT MEMORY DEVICES

(75) Inventors: Chang-Man Khang, Kyounggi-do (KR); Joung-Yeal Kim, Kyounggi-do (KR)

(73) Assignee: Samsung Electronics Co., Ltd., (KR)

( * ) Notice: Subject to any disclaimer, the term of this patent is extended or adjusted under 35 U.S.C. 154(b) by 177 days.

(21) Appl. No.: 10/632,439

(22) Filed: Jul. 31, 2003

(65) Prior Publication Data

US 2005/0024947 A1 Feb. 3, 2005

(30) Foreign Application Priority Data

Jul. 31, 2002 (KR) ............................... 2002-45287

(51) Int. Cl.
*G11C 16/04* (2006.01)

(52) U.S. Cl. ........................... 365/189.01; 365/189.02; 365/189.04; 365/189.05; 365/189.12; 365/194

(58) Field of Classification Search ........... 365/189.01, 365/189.02, 189.04, 189.05, 189.12, 194
See application file for complete search history.

(56) References Cited

U.S. PATENT DOCUMENTS

| | | | | |
|---|---|---|---|---|
| 5,895,482 | A | 4/1999 | Toda | |
| 5,940,334 | A * | 8/1999 | Holst | 365/190 |
| 5,978,884 | A | 11/1999 | Yamaguchi et al. | |
| 6,055,210 | A | 4/2000 | Setogawa | |
| 6,154,417 | A | 11/2000 | Kim | |
| 6,243,797 | B1 | 6/2001 | Merritt | |
| 6,288,947 | B1 | 9/2001 | Kim et al. | |
| 6,337,830 | B1 | 1/2002 | Faue | |
| 6,404,697 | B1 * | 6/2002 | Ryu et al. | 365/230.04 |

* cited by examiner

*Primary Examiner*—Anh Phung
*Assistant Examiner*—Pho M. Luu
(74) *Attorney, Agent, or Firm*—Myers Bigel Sibley & Sajovec

(57) ABSTRACT

A data output circuit includes a plurality of registers and a plurality of register output selection switches that are respectively connected to the plurality of registers. Pairs of the plurality of register output selection switches are connected by respective common active regions. A first data group selection switch is connected to the common active regions of a first set of the plurality of register output selection switches. A second data group selection switch is connected to the common active regions of a second subset of the plurality of register output selection switches. An output driver is connected to the first and second data group selection switches.

7 Claims, 9 Drawing Sheets

DATA OUTPUT CIRCUITS FOR SYNCHRONOUS INTEGRATED CIRCUIT MEMORY DEVICES

RELATED APPLICATION

This application claims the benefit of Korean Patent Application No. 2002-45287, filed Jul. 31, 2002, the disclosure of which is hereby incorporated herein by reference.

FIELD OF THE INVENTION

The present invention relates to integrated circuit memory devices, and, more particularly, to data output circuits for synchronous integrated circuit memory devices.

BACKGROUND OF THE INVENTION

In conventional integrated circuit memory devices, various kinds of pipeline structures have been used to increase the speed in a column output path. One example of such a pipeline structure is a wave pipeline structure in which a plurality of registers is used. The wave pipeline structure has a relatively simple circuit construction and operates at relatively high speed. As a result, wave pipeline structures are often used in synchronous integrated circuit memory devices.

FIG. 1 is a block diagram that illustrates a data output path in a conventional synchronous integrated circuit memory device and also illustrates a column output path in a read operation mode. Referring now to FIG. 1, a read command is input to the synchronous integrated circuit memory device. Next, memory cell data, which is respectively output through bit line sense amplifiers 2, 3, 4, 5, is provided to a corresponding local input/output line (LI0i: i ranging from 1 to 3) through each corresponding column selection transistor M1–M4 that respectively respond to column selection signals CSL0–CSL3 applied from a column address decoder (not shown). input/output sense amplifiers 6, 7, 8, 9 are respectively connected to the local input/output lines L100–L103 and are configured to amplify data provided to the local input/output lines L100–L103 and apply the amplified data to a multiplexer 10 connected to a global input/output line.

The multiplexer 10 multiplexes the data output from the input/output sense amplifiers 6, 7, 8, 9, and applies the data to a data output multiplexer 100. The data is transferred from the multiplexer 10 through one switch selected among a plurality of data line switches SF1–SF16 within the data output multiplexer 100. The data line switches SF1–SF16 are activated in response to a data line selection signal applied through data line selection signal lines DL0–DL3 and apply output data from the multiplexer 10 to a corresponding register. The output data respectively stored at the first through nth registers 101–116 are provided to input terminals of a plurality of register output selection switches S1–S16. When one of the register output selection switches S1–S16 is switched on by a switching selection signal, the data is provided onto a multiplexing output line.

The switching selection signals (CDQ0_F-CDQ7_F, CDQ0_S-CDQ7_S) are provided to the register output selection switches S1–S16 according to the timing diagram of FIG. 2. The switching selection signals (CDQ0_F-CDQ7_F) are generated in response to a first edge (a rising edge or a falling edge) of a clock signal CLK shown in FIG. 2. The switching selection signals (CDQ0_S-CDQ7_S) are generated in response to a second edge (a falling edge or a rising edge) of the clock CLK. FIG. 2 further illustrates a data output operation of the integrated circuit memory device of FIG. 1. Data (DOFi, DOSi) respectively representing the data on two multiplexing output lines are individually applied to input terminals of first and second data group selection switches SW1, SW2. When one of the first and second data group selection switches SW1, SW2 is switched on in response to group selection output switching signals (CLKDQ_F, CLKDQ_S) that are applied complementarily to one another, output data DOUT, which is synchronized to a clock, is output through an output pin PD1 connected to an output terminal of an output driver 30 as shown in FIG. 2.

As described above with respect to FIGS. 1 and 2, a function of the data output multiplexer 100 is to provide a double data rate DDB output operation. The data output circuit comprises the data output multiplexer 100 together with the first and second data group selection switches SW1, SW2 and the output driver 30. The data output multiplexer 100 is used to ensure a high-speed data output operation of about 500 MHz to reduce data skew and junction loading and/or wiring loading.

A conventional double data rate data output multiplexer 100 may have a wave pipeline structure as discussed above, but there is room for improvement in the art. Referring now to FIG. 3, switches S1–S4 are connected to the multiplexing output line DOFi. Each of the switches S1–S4 may comprise a CMOS transmission gate, but is illustrated herein as one MOS transistor for convenience. FIG. 3 also illustrates various signal lines coupled to the gate G, source S and drain D regions. As shown in FIG. 3, the multiplexing output line DOFi has four junction portions. Thus, the multiplexing output line DOFi within the data output multiplexer 100 of FIG. 1 has eight junction portions (eight switches S1 through S8). Because the junction loading on the multiplexing output lines DOFi and DOSi is relatively large, a data output time may be delayed.

FIG. 4 schematically shows lengths of wire lines (L1, L2, L3, and L4) that are disposed before/after the plurality of register output selection switches S1–S8 and the multiplexing output line L3. Referring now to FIG. 4, a length (D2*a*) of the wire line L2 is longer than a length (D1*a*) of the wire line L1, and a length (D3*a*) of the wire line L3 is also relatively long. In general, if a length of the wire line L2, which is made of metal, is relatively long, then a wire loading is concentrated onto a multiplexing output node and a data output may be delayed.

FIG. 5 shows a disposition relation between the plurality of register output selection switches S1–S16 and the first and second data group selection switches SW1, SW2. Wiring lengths of the multiplexing output lines DOFi, DOSi are different from each other. That is to say, a data output path PA1 passing through a first register 101, a data output path PA2 passing through an eighth register 108, and a data output path PA3 passing through an nth register 116, are all different from one another. Thus, data skew may occur.

FIGS. 6 and 7 respectively show a connection relation of the overlap prevention control signal lines CL1–CL5 for respectively providing complementary switching selection signals, which are applied to the register output selection switches S1–S16. For example, when the switch S1 of FIG. 6 is switched on, the switch S16 is switched off, and when the switch S2 is switched on, the switch S15 is switched off so as to prevent an overlap of data. If switch S1 is switched on by a high signal, a low signal inverted from the high signal is applied to the switch S16. The low signal functions as an overlap prevention control signal.

As shown in FIG. 6, a considerable difference in length exists between the overlap prevention control signal line CL1 and the overlap prevention control signal line CL3. Further, as shown in FIG. 7, only the overlap prevention control signal line CL1 is longer than other overlap prevention control signal lines CL2, CL3, CL4, CL5. Therefore, if the overlap prevention control signal lines have different lengths, a path difference may cause a multiplexing overlap of output data.

SUMMARY OF THE INVENTION

In accordance with some embodiments of the present invention, a data output circuit comprises a plurality of registers and a plurality of register output selection switches that are respectively connected to the plurality of registers. Pairs of the plurality of register output selection switches are connected by respective common active regions. A first data group selection switch is connected to the common active regions of a first set of the plurality of register output selection switches. A second data group selection switch is connected to the common active regions of a second subset of the plurality of register output selection switches. An output driver is connected to the first and second data group selection switches.

In other embodiments, the plurality of register output selection switches comprises a plurality of CMOS transmission gates, respectively.

In further embodiments, a data output circuit comprises a plurality of registers and a plurality of register output selection switches that are respectively connected to the plurality of registers via a plurality of first wires having first lengths. A data group selection switch is connected to the plurality of register output selection switches by a plurality of second wires having second lengths that are shorter than the first lengths. An output driver is connected to the data group selection switch.

In still further embodiments, a data output circuit comprises a plurality of registers and a plurality of register output selection switches respectively connected to the plurality of registers. A first data group selection switch is connected to a first subset of the plurality of register output selection switches via a first line having a first length. A second data group selection switch that is connected to a second subset of the plurality of register output selection switches via a second line having a second length that is approximately equal to the first length. An output driver is connected to the first and second data group selection switches.

In still further embodiments, a data output circuit comprises a plurality of registers and a plurality of register output selection switches respectively connected to the plurality of registers and arranged in a circular configuration. Respective ones of a plurality of overlap prevention control signal lines are connected to pairs of the plurality of register output selection switches. A data group selection switch is connected to the plurality of register output selection switches. An output driver is connected to the data group selection switch.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
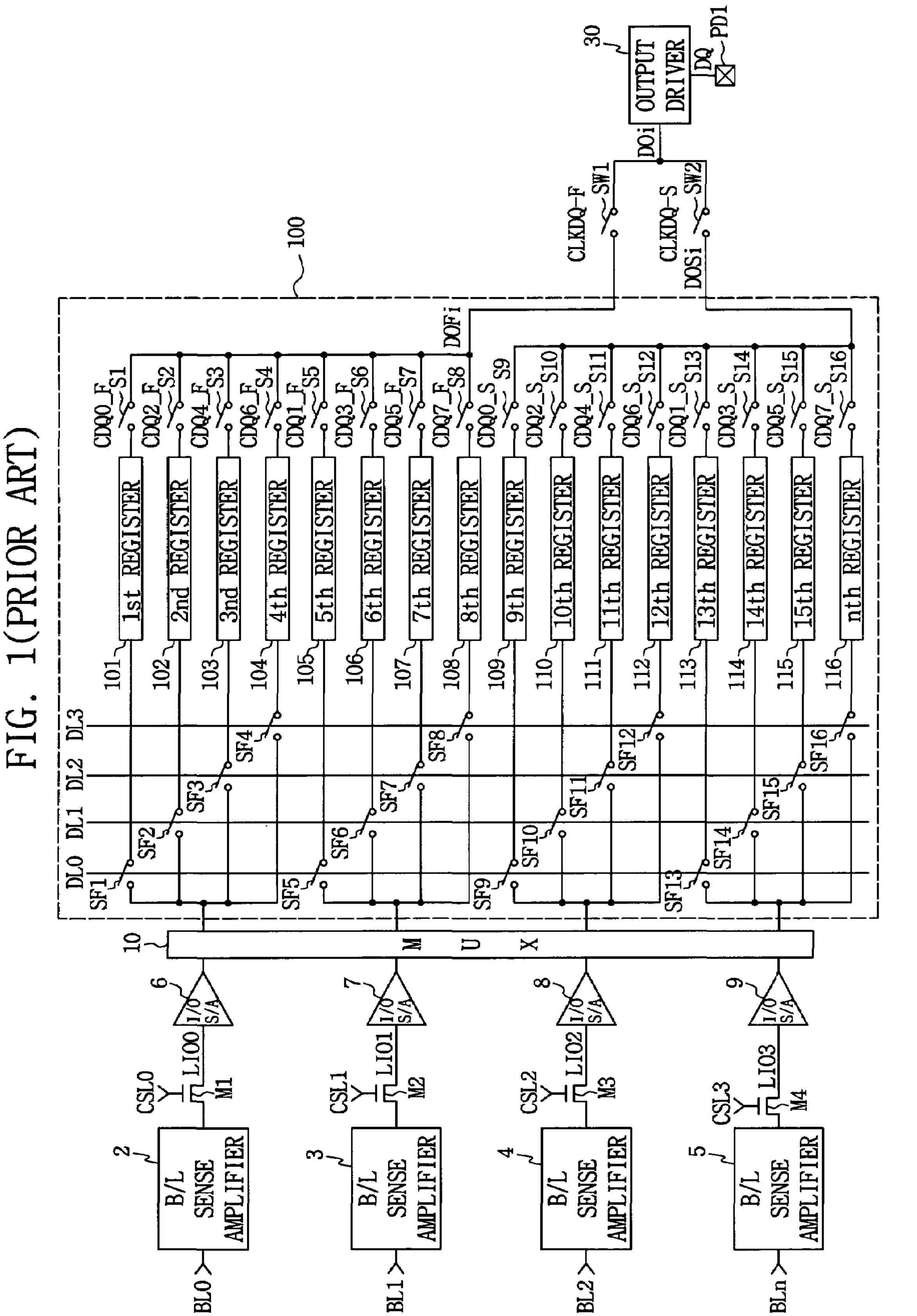
FIG. 1 is a block diagram that illustrates a data output circuit in a conventional synchronous integrated circuit memory device.
Figure 2:
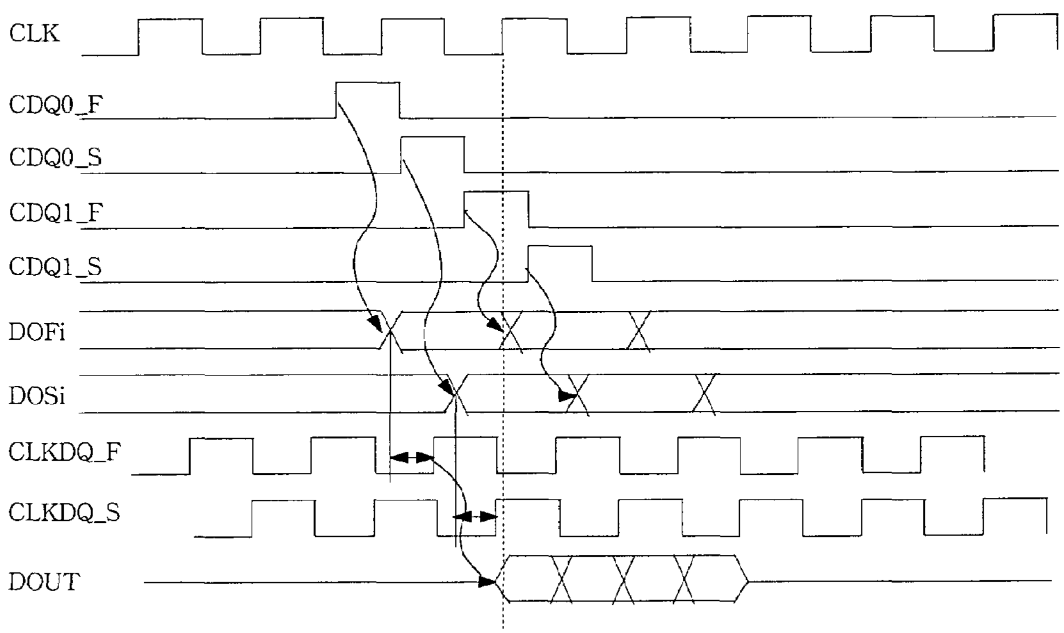
FIG. 2 is a timing diagram of a data output operation of the data output circuit of FIG. 1.
Figure 3:
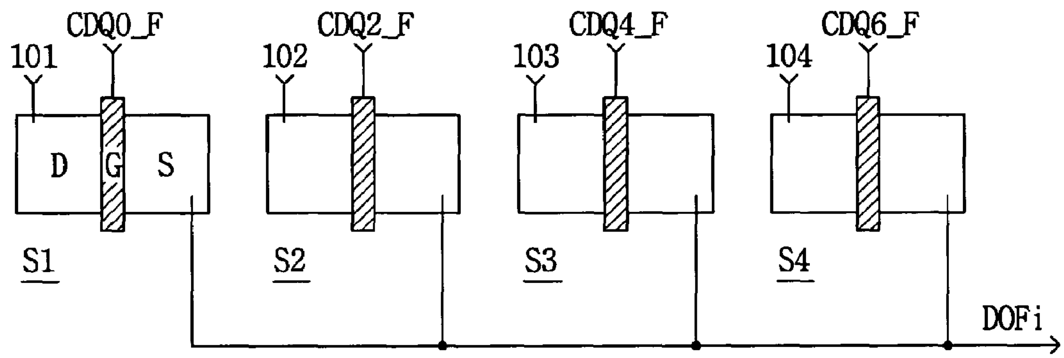
FIG. 3 is a schematic that illustrates register output selection switches of FIG. 1.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

In accordance with various embodiments of the present invention, a data output circuit for use in a synchronous integrated circuit memory device having a wave pipeline data output multiplexer structure will now be described.

Figure 8:
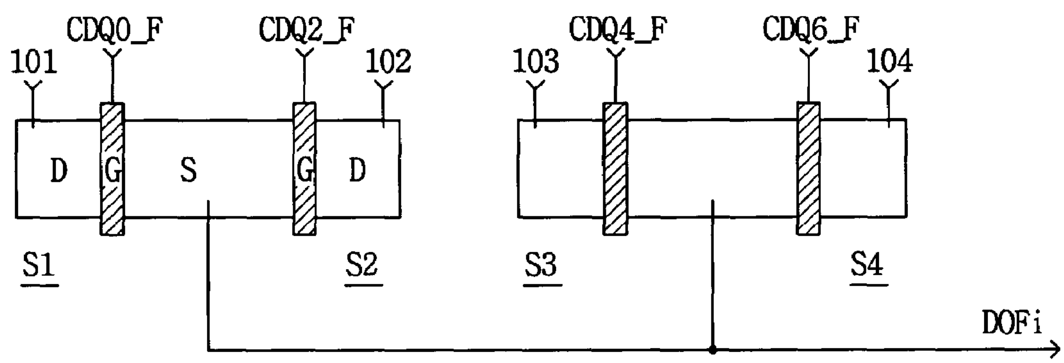
FIGS. 8 and 9 are schematics that illustrate register output selection switches for a data output circuit in accordance with some embodiments of the present invention.
Figure 9:
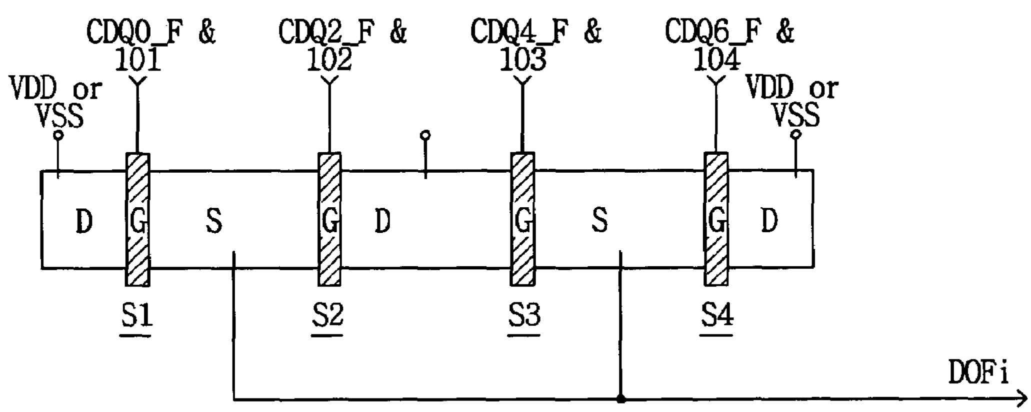
Figure 4:
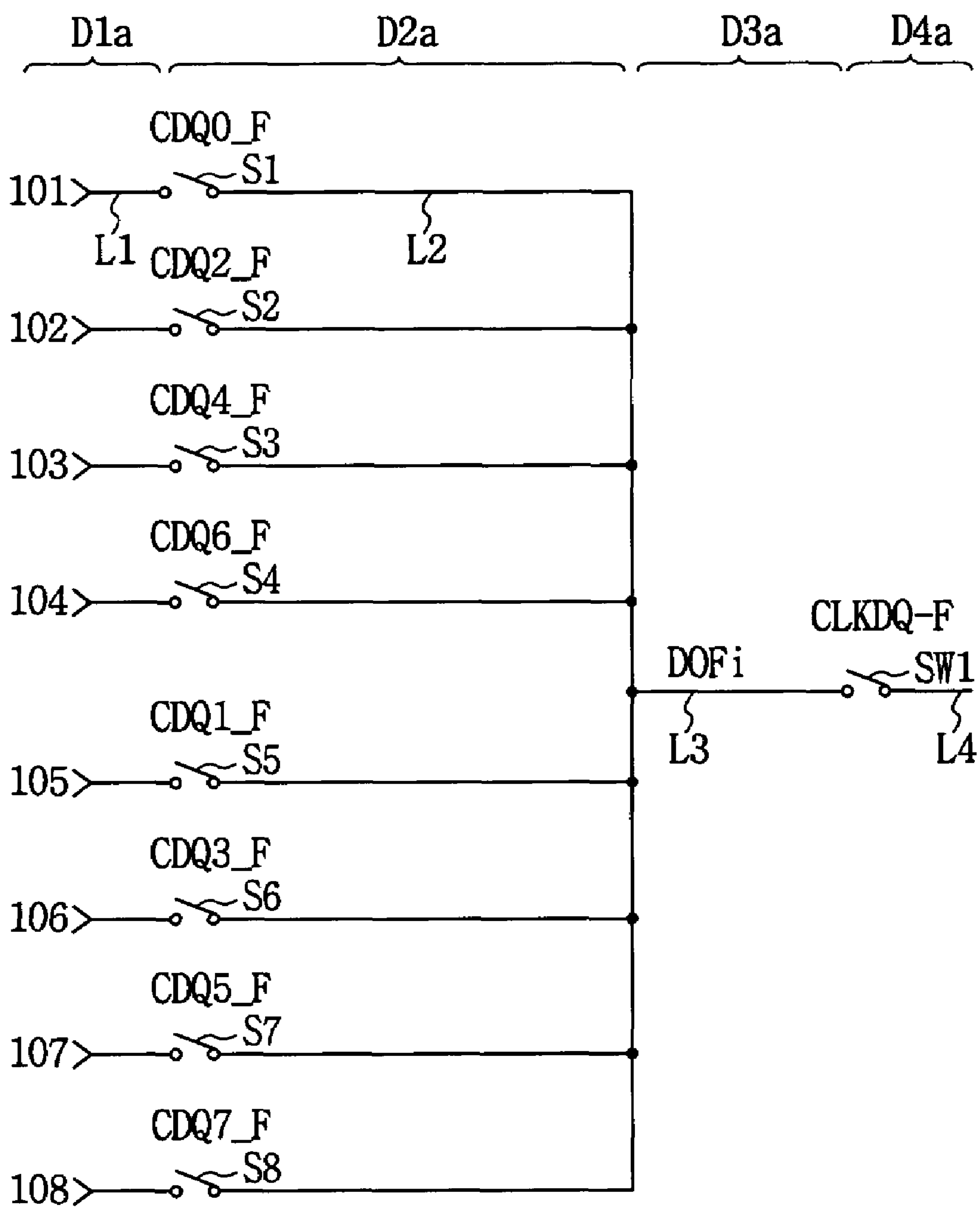
FIG. 4 is schematic that illustrates register output selection switches and a data group selection switch of FIG. 1.
Figure 5:
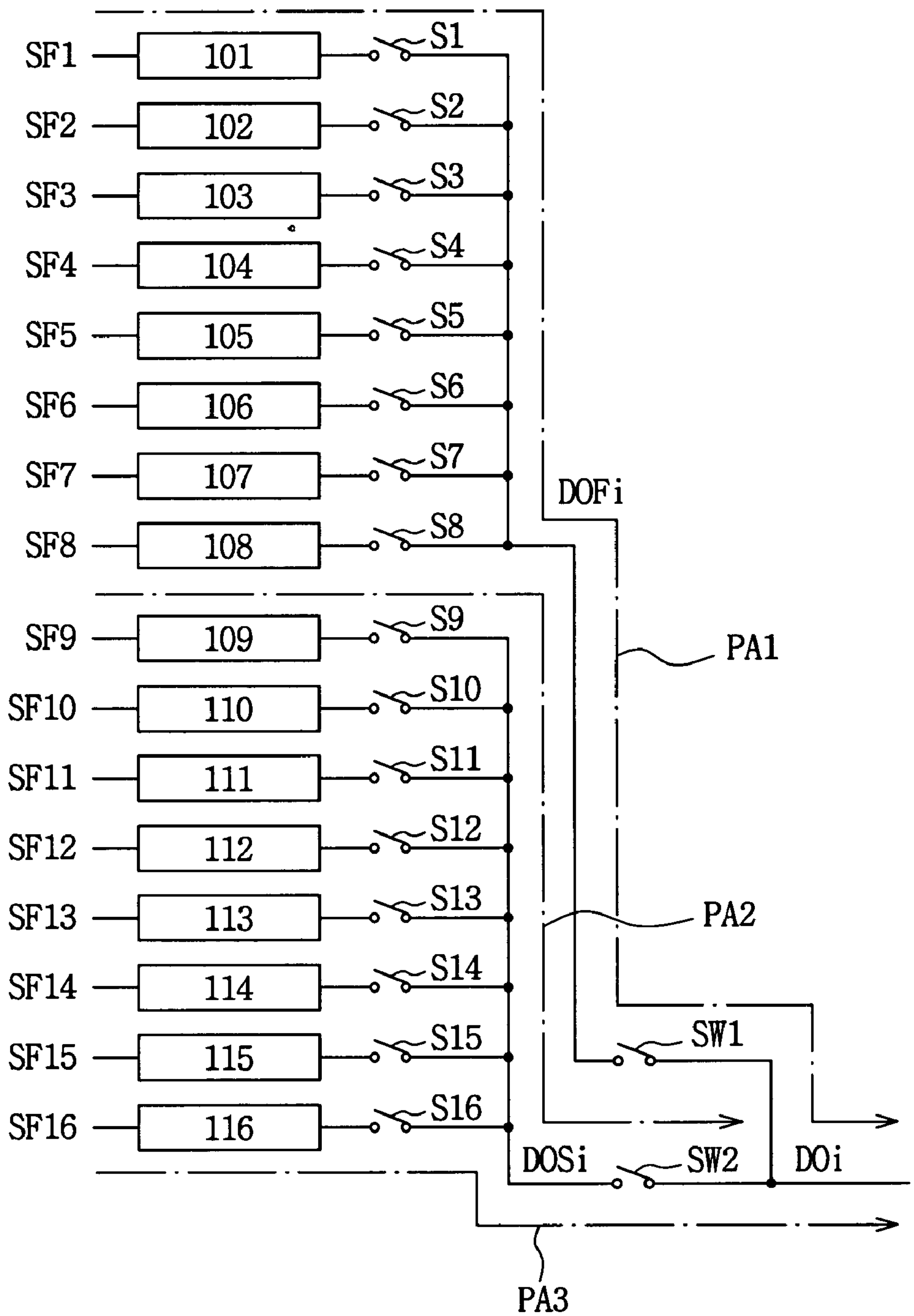
FIG. 5 is a schematic that illustrates the wiring of the register output selection switches and data group selection switches of FIG. 1.
Figure 6:
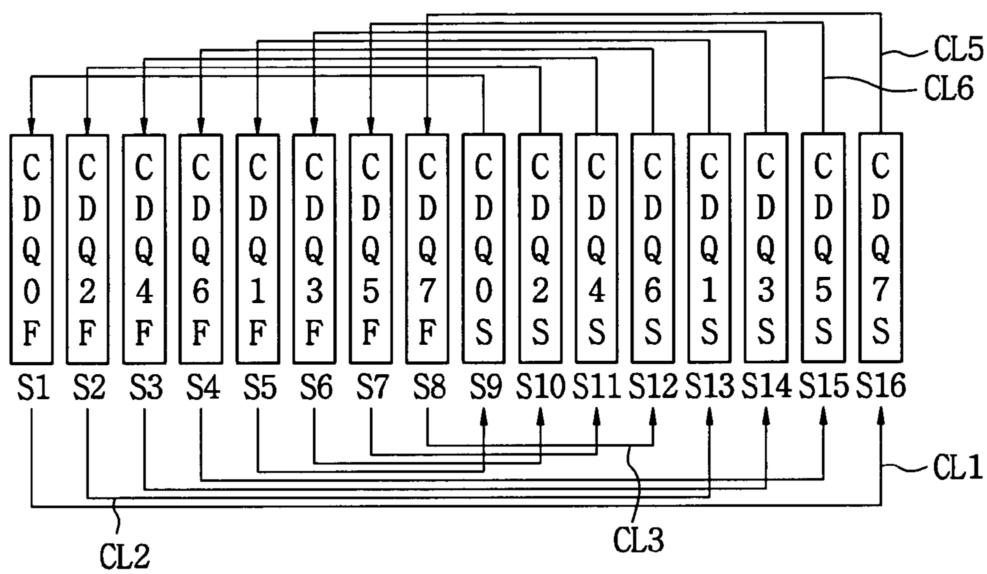
FIGS. 6 and 7 are schematics that illustrate overlap prevention control signal lines for the data output circuit of FIG. 1.
Figure 7:
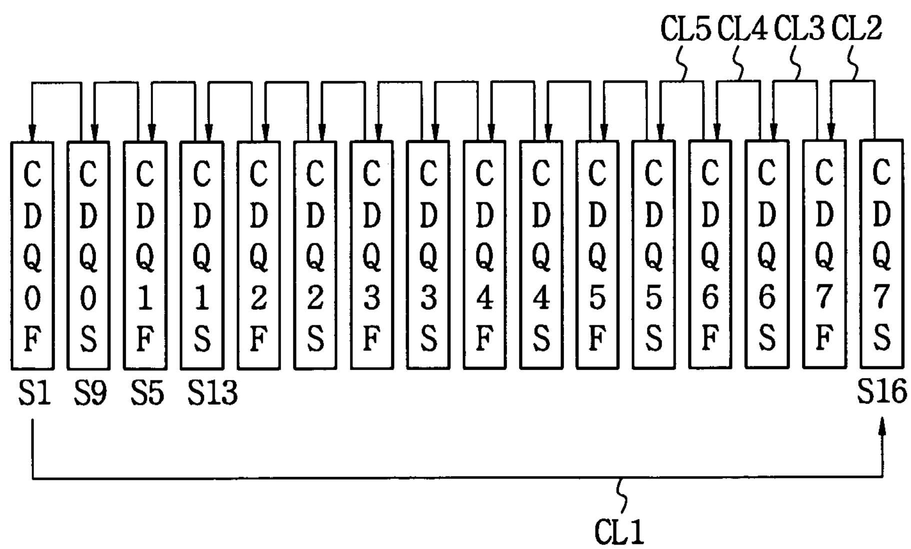

Referring now to FIGS. 8 and 9, a connection configuration between a multiplexing output line DOFi and switches S1–S4 of the plurality of register output selection switches S1–S16, which may reduce junction loading is illustrated. As shown in FIG. 8, active regions S for mutually adjacent register output selection switches S1, S2 are formed in common. Therefore, the multiplexing output line DOFi shown in FIG. 8 has two junction portions. The multiplexing output line DOFi within the data output multiplexer 100 of FIG. 1 would have four junction portions because of the eight switches S1 through S8. Thus, the junction loading on the multiplexing output lines DOFi, DOSi may be reduced by half.

FIG. 9 shows that a drain terminal D is coupled to a voltage source VDD or a ground voltage VSS, a source terminal is used in common, and output data from a register and a switching selection signal CDQX_F are AND-gated and applied to a gate terminal G. Again, the multiplexing output line DOFi shown in FIG. 8 has two junction portions. Thus, the junction loading on the multiplexing output lines DOFi, DOSi may be reduced by half. In accordance with some embodiments of the present invention, the register output selection switches may comprise CMOS transmission gates, respectively.

That is, when the output part active regions S for mutually adjacent register output selection switches S1, S2 are formed in common, the output terminals for two register output selection switches are connected to the multiplexing output line through a single line. Thus, the junction loading of the multiplexing output line that is connected in common with lines connected with the output terminals of the register output selection switches is reduced.

Figure 10:
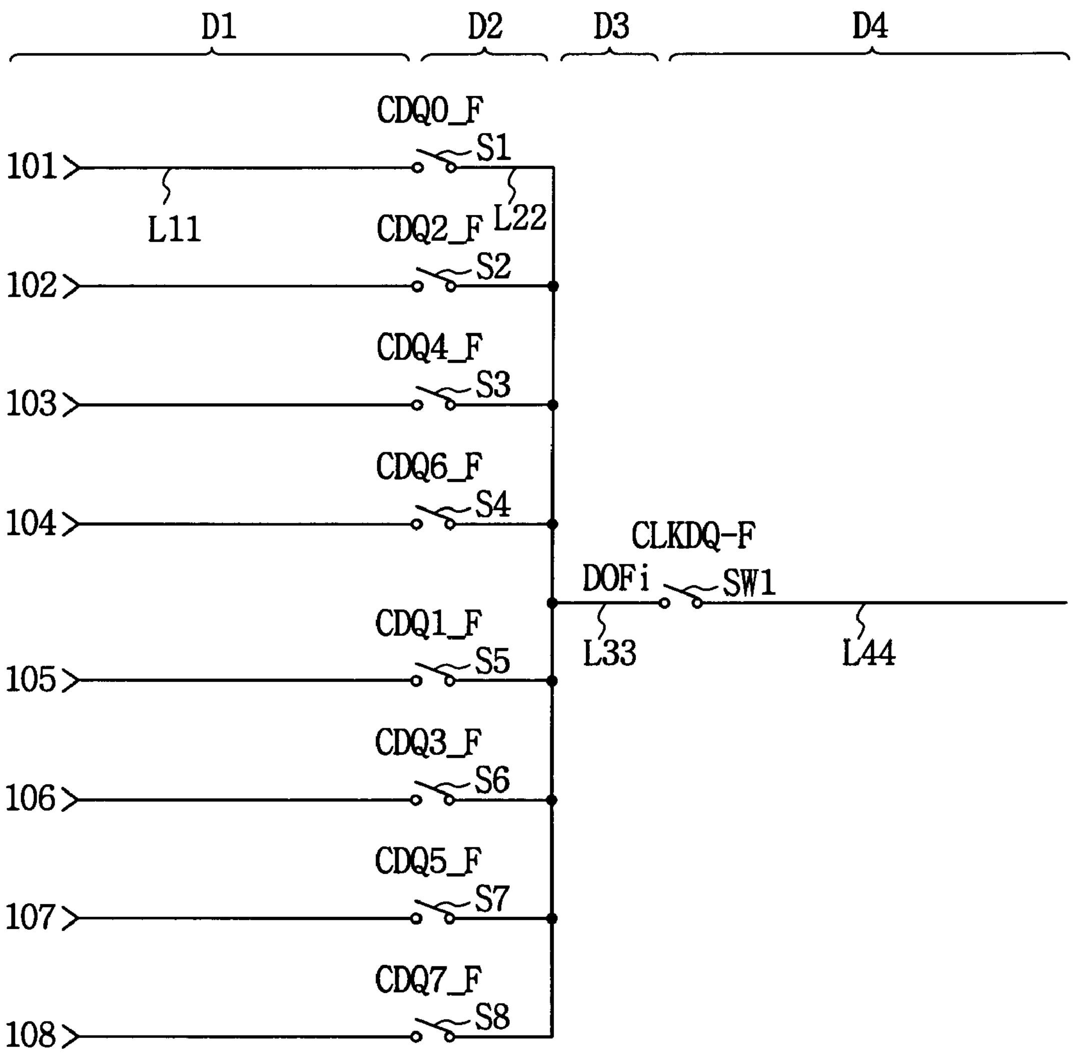
FIG. 10 is a schematic that illustrates the wiring of register output selection switches and a data group selection switch in accordance with some embodiments of the present invention.

FIG. 10 illustrates a disposition of the wire lines to reduce wire loading in accordance with some embodiments of the present invention. Referring now to FIG. 10, wires having lengths L11, L22, L33, and L44 are disposed before/after a plurality of register output selection switches S1–S8. A length D2 of the wire line L22 is shorter than a length D1 of the wire line L11, and a length D3 of the wire line L33 is relatively short compared to the length L11. Therefore, when the length of the wire line L22 and L33 is shorter than the length of wire line L11, wire loading at the multiplexing output node may be reduced and data output delay may also be reduced. Note that the distance between the plurality of register output selection switches S1 through S8 is presumed to be significantly less than the length of the wires L11, L22, L33, and L44.

Thus, in accordance with some embodiments of the present invention, the lengths of lines connected to output terminals of the register output selection switches are shorter than the lengths of lines connected to input terminals of the register output selection switches. As a result, wire loading of the multiplexing output line, which is coupled in common with the lines that are connected to the output terminals of the register output selection switches within the data output multiplexer, may be reduced.

Figure 11:
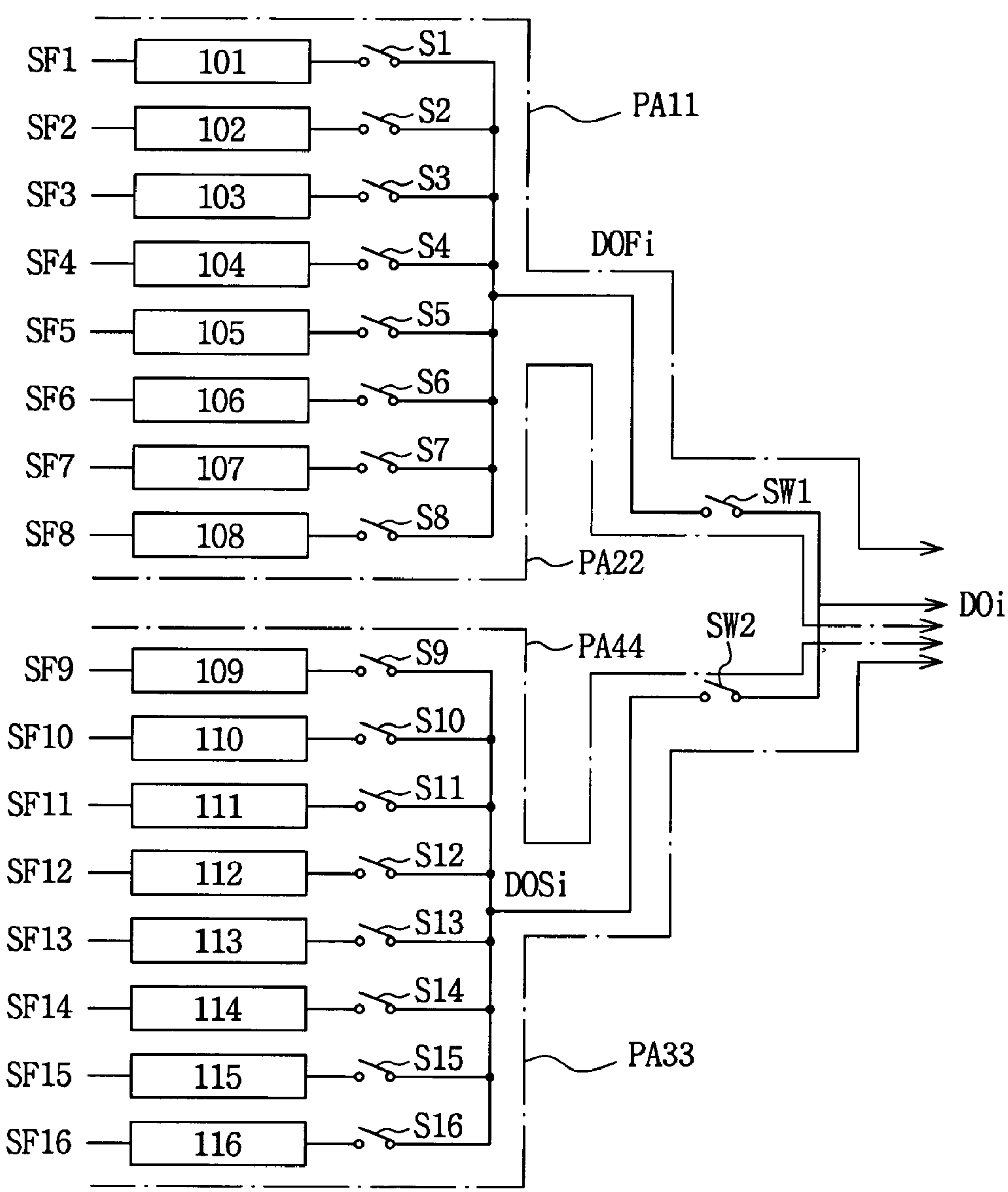
FIG. 11 is a schematic that illustrates the wiring of register output selection switches and data group selection switches in accordance with some embodiments of the present invention.

FIG. 11 illustrates a disposition of the wire lines to reduce skew between output data in accordance with some embodiments of the present invention. As shown in FIG. 11, the wiring lengths of the multiplexing output lines DOFi, DOSi are equal and all of the data output path PA11 passing through a first register 101, the data output path PA22 passing through an eighth register 108, and a data output path PA33 passing through an nth register 116 are equal in the length. Thus, the first and second data group selection switches SW1, SW2 are disposed near a center of the lines connected to the output terminals of the register output selection switches. The lengths of the first and second multiplexing output lines, which connect the register output selection switches S1 through S16 with the first and second data group selection switches SW1 and SW2, are almost the same. As a result, skew between output data respectively output through the lines that are connected to the output terminals of the register output selection switches within the data output multiplexer may be reduced.

Figure 12:
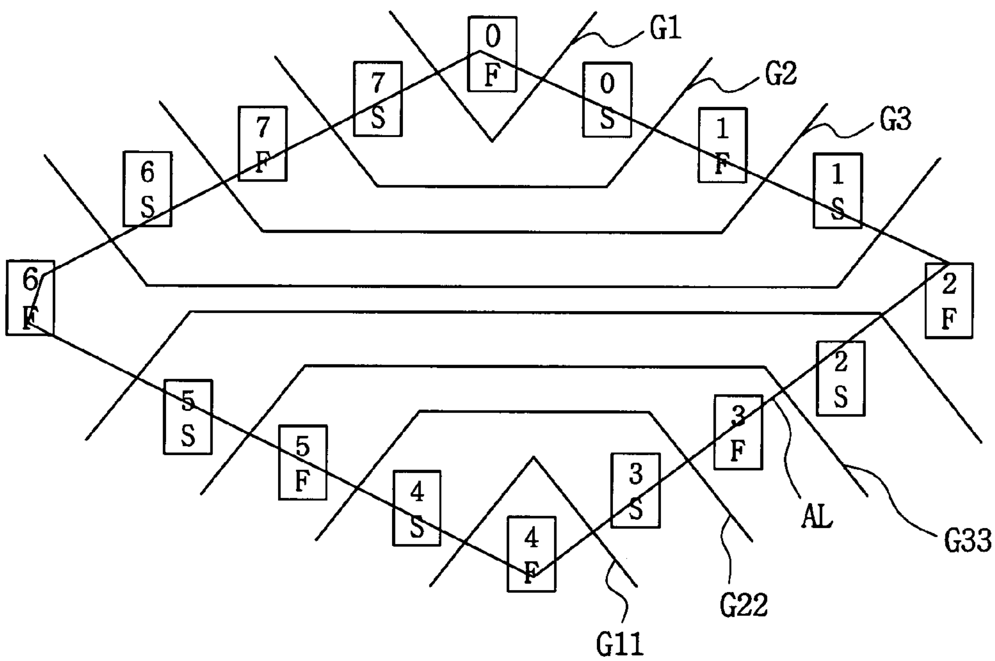
FIGS. 12 and 13 are schematics that illustrate overlap prevention control signal lines for a data output circuit in accordance with some embodiments of the present invention.
Figure 13:
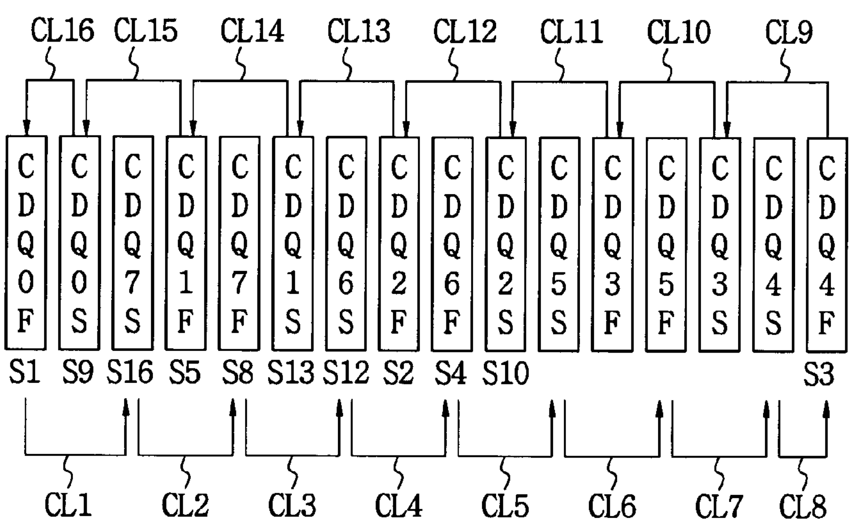

FIGS. 12 and 13 illustrate a disposition of the register output selection switches S1 through S16 to reduce multiplexing overlap of output data in accordance with some embodiments of the present invention. Referring now to FIG. 12, the register output selection switches S1–S16 are disposed in a wrap-around configuration. Referring now to FIG. 13, most of the overlap prevention control signal lines are individually connected between switches having one switch therebetween. As a result, lengths of the control signal lines are about equal so as to prevent a multiplexing overlap of data. In FIG. 13, for example, when switch S1 is switched on, switch S16 is switched off, and when switch S16 is switched on, switch S8 is switched off As shown in FIG. 13, lengths of all wires except the overlap prevention control signal lines CL8 and CL16 are about the same.

By arranging the register output selection switches in a wrap-around configuration, most of the overlap prevention control signal lines connect two of the switches with one switch in between. As a result, most of the overlap prevention control signal lines have about the same wiring length. As a result, a skew between output data individually output through lines that are connected to the output terminals of the register output selection switches within the data output multiplexer may be reduced, and a path difference between various ones of the overlap prevention control signal lines may be reduced so as to avoid a multiplexing overlap of the output data.

Thus, in accordance with various embodiments of the present invention, junction loading, wire loading, data skew, and data overlap may be reduced. As a result, a data output circuit in an integrated circuit memory device may operate at higher speeds.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A data output circuit, comprising:

a plurality of registers;

a plurality of register output selection switches respectively connected to the plurality of registers via a plurality of first wires having first lengths, pairs of the plurality of register output selection switches being connected by respective common active regions;

a first data group selection switch that is connected to the common active regions of a first subset of the plurality of register output selection switches via a plurality of second wires having second lengths that are shorter than the first lengths;

a second data group selection switch that is connected to the common active regions of a second subset of the plurality of register output selection switches via a plurality of third wires having third lengths that are shorter than the first lengths, the first and second data group selection switches being disposed approximately a same distance from the first and second subsets of the plurality of register output selection switches, respectively; and an output driver that is connected to the first and second data group selection switches.

2. The data output circuit of claim 1, wherein the plurality of register output selection switches comprises a plurality of CMOS transmission gates, respectively.

3. A data output circuit, comprising:

a plurality of registers;

a plurality of register output selection switches respectively connected to the plurality of registers, pairs of the plurality of register output selection switches being connected by respective common active regions;

a first data group selection switch flint is connected to the common active regions of a first subset of the plurality of register output selection switches;

a second data group selection switch that is connected to the common active regions of a second subset of the plurality of register output selection switches; and an output driver that is connected to the first and second data group selection switches.

4. The data output circuit of claim 3, wherein the plurality of register output selection switches comprises a plurality of CMOS transmission gates, respectively.

5. A data output circuit, comprising:

a plurality of registers;

a plurality of register output selection switches respectively connected to the plurality of registers via a plurality of first wires having first lengths;

a data group selection switch that is connected to the plurality of register output selection switches by a plurality of second wires having second lengths that are shorter than the first lengths; and an output driver that is connected to the data group selection switch.

6. A data output circuit, comprising:

a plurality of registers;

a plurality of register output selection switches respectively connected to the plurality of registers;

a first data group selection switch that is connected to a first subset of the plurality of register output selection switches via a first line having a first length;

a second data group selection switch that is connected to a second subset of the plurality of register output selection switches via a second line having a second length that is approximately equal to the first length; and an output driver that is connected to the first and second data group selection switches.

7. A data output circuit, comprising:

a plurality of registers;

a plurality of register output selection switches respectively connected to the plurality of registers and arranged in a circular configuration;

a plurality of overlap prevention control signal lines respective ones of which are connected to pairs of the plurality of register output selection switches;

a data group selection switch that is connected to the plurality of register output selection switches; and an output driver that is connected to the data group selection switch.

* * * * *

UNITED STATES PATENT AND TRADEMARK OFFICE

CERTIFICATE OF CORRECTION

PATENT NO. : 7,002,852 B2
DATED : February 21, 2006
INVENTOR(S) : Khang et al.

It is certified that error appears in the above-identified patent and that said Letters Patent is hereby corrected as shown below:

Column 7,
Line 1, should read -- a first data group selection switch that is connected to the --.

Signed and Sealed this

Twenty-seventh Day of June, 2006

JON W. DUDAS
*Director of the United States Patent and Trademark Office*